United States Patent
Derner et al.

(10) Patent No.: US 10,916,295 B2
(45) Date of Patent: Feb. 9, 2021

(54) MEMORY ARRAYS WITH VERTICAL THIN FILM TRANSISTORS COUPLED BETWEEN DIGIT LINES

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/110,349

(22) Filed: Aug. 23, 2018

(65) Prior Publication Data

US 2020/0066327 A1    Feb. 27, 2020

(51) Int. Cl.
| | | |
|---|---|---|
| G11C 11/24 | (2006.01) | |
| G11C 11/4097 | (2006.01) | |
| H01L 27/108 | (2006.01) | |
| G11C 11/4091 | (2006.01) | |
| H01L 27/12 | (2006.01) | |
| H01L 29/786 | (2006.01) | |
| H01L 27/11507 | (2017.01) | |
| H01L 27/11509 | (2017.01) | |

(52) U.S. Cl.
CPC ...... G11C 11/4097 (2013.01); G11C 11/4091 (2013.01); H01L 27/10808 (2013.01); H01L 27/10897 (2013.01); H01L 27/1207 (2013.01); H01L 27/11507 (2013.01); H01L 27/11509 (2013.01); H01L 29/78642 (2013.01)

(58) Field of Classification Search
CPC ............. G11C 11/4097; G11C 11/4091; H01L 27/10808; H01L 29/78642
See application file for complete search history.

(56) References Cited

U.S. PATENT DOCUMENTS

| | | | |
|---|---|---|---|
| 6,456,521 B1 | 9/2002 | Hsu et al. | |
| 9,472,252 B2 | 10/2016 | Hofstetter et al. | |
| 2004/0245547 A1 | 12/2004 | Stipe | |
| 2005/0047197 A1* | 3/2005 | Kotabe | ................. G11C 11/412 |
| | | | 365/154 |
| 2009/0121269 A1 | 5/2009 | Caillat et al. | |
| 2009/0175066 A1 | 7/2009 | Kim | |

(Continued)

OTHER PUBLICATIONS

International Search Report and Written Opinion from related international application No. PCT/US2019/031461, dated Aug. 21, 2019, 13 pages.

(Continued)

*Primary Examiner* — Uyen Smet
(74) *Attorney, Agent, or Firm* — Brooks, Cameron & Huebsch, PLLC

(57) ABSTRACT

In the examples disclosed herein, a memory array can have a first group of memory cells coupled to a first digit line at a first level and a second group of memory cells coupled to a second digit line at the first level. A third digit line can be at a second level and can be coupled to a main sense amplifier. A first vertical thin film transistor (TFT) can be at a third level between the first and second levels can be coupled between the first digit line and the third digit line. A second vertical TFT can be at the third level and can be coupled between the second digit line and the third digit line. A local sense amplifier can be coupled to the first and second digit lines.

23 Claims, 6 Drawing Sheets

(56) References Cited

U.S. PATENT DOCUMENTS

| | | |
|---|---|---|
| 2012/0196415 A1 | 8/2012 | Masuoka et al. |
| 2013/0070506 A1* | 3/2013 | Kajigaya ............... G11C 7/18 |
| | | 365/51 |
| 2013/0170283 A1* | 7/2013 | Lan ................ G11C 13/0007 |
| | | 365/148 |
| 2014/0248763 A1* | 9/2014 | Konevecki ........ H01L 21/28008 |
| | | 438/591 |
| 2015/0255599 A1 | 9/2015 | Surthi |

OTHER PUBLICATIONS

Office Action and Search Report from related Taiwan patent application No. 108117280, dated Mar. 23, 2020, 2019, 12 pages.

* cited by examiner

MEMORY ARRAYS WITH VERTICAL THIN FILM TRANSISTORS COUPLED BETWEEN DIGIT LINES

TECHNICAL FIELD

The present disclosure relates generally to memory devices, and more particularly, to memory arrays with vertical thin film transistors coupled between digit lines.

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random access memory (DRAM), static random access memory (SRAM), and synchronous dynamic random access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric-random-access memory (FeRAM), or the like.

In some examples, DRAM memory arrays can include respective groups of DRAM memory cells coupled to respective digit lines. A respective memory cell from each group can be commonly coupled to a respective access line, such as a word line. In some examples, a DRAM memory cell can include a storage device, such as a capacitor, coupled by a transistor, such as an access transistor, to a digit line. The access transistor can be activated (e.g., to select the cell) by an access line coupled to the access transistor. The capacitor can store a data value of a respective cell, such as a logic "1" or "0," as a charge on the capacitor.

DETAILED DESCRIPTION

In the examples disclosed herein, a memory array can have respective groups of memory cells coupled to respective digit lines (e.g., local digit lines). An additional digit line (e.g., a hierarchical digit line) can be at a different level (e.g., a different vertical level) than the local digit lines and can be coupled to a main sense amplifier. For example, the hierarchical digit line can be at a vertical level above the vertical level of the local digit lines. Respective (e.g., vertical) thin film transistors (TFTs) that can be referred to as multiplexing transistors can be at a level (e.g., a vertical level) between the level of the local digit lines and the level of the hierarchical digit line and can be coupled between the hierarchical digit line and each respective local digit line. A local sense amplifier can be coupled to adjacent local digit lines.

The local digit lines selectively coupled to the hierarchical digit line by the vertical TFTs can be referred to as a hierarchical scheme. Hierarchical schemes can be applied to achieve high-speed operation, for example.

The vertical TFTs at the level between the local digit lines and the hierarchical digit line can reduce the space requirements compared to previous approaches that may use planar transistors below the local digit lines to couple the local digit lines to the hierarchical digit line. The local sense amplifier can amplify the signal in the hierarchical digit line that can weaken with distance along the hierarchical digit line and can allow for a longer hierarchical digit line, and thus more local digit lines and more groups of memory cells.

Figure 1:
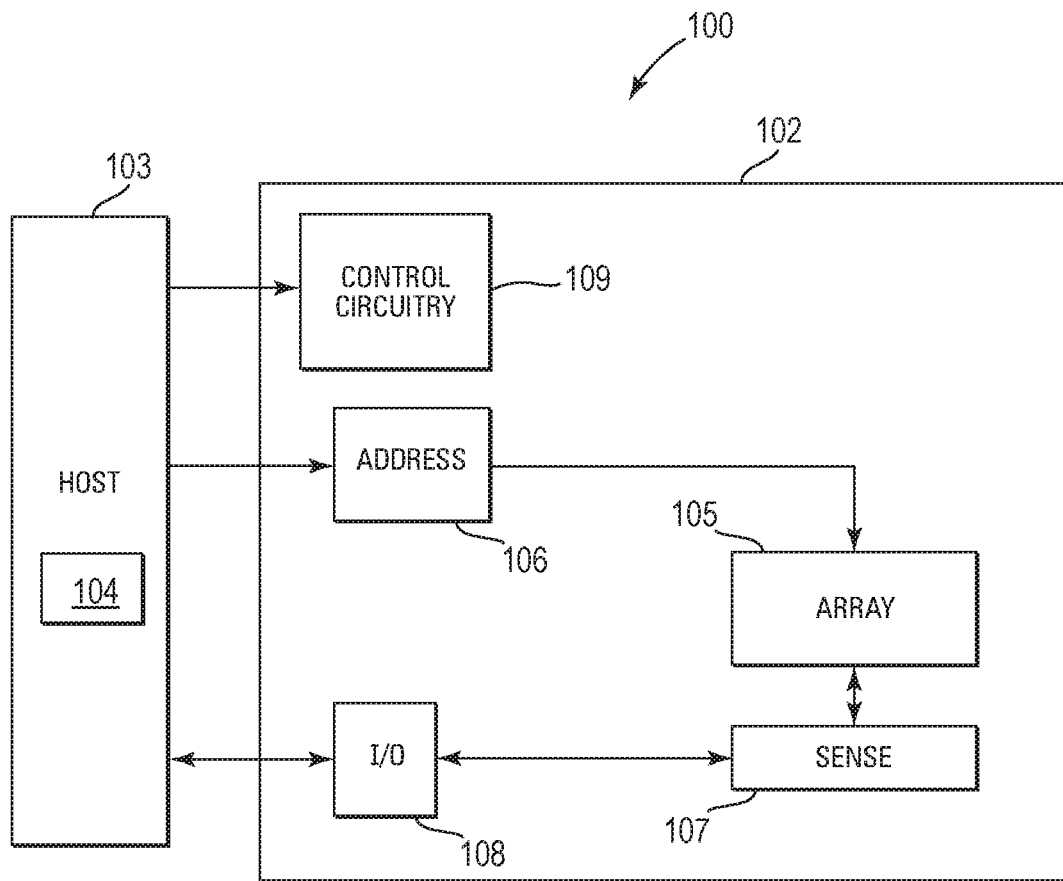
FIG. 1 is a block diagram of an apparatus in accordance a number of embodiments of the present disclosure.

FIG. 1 is a block diagram of an apparatus in accordance a number of embodiments of the present disclosure. For example, the apparatus can be an electronic system, such as a computing system 100. Computing system 100 can include a memory device 102 coupled to a host 103. Host 103 can include a processing device 104 that can include a host processor. Host 103 can be a host system, such as a personal laptop computer, a desktop computer, a digital camera, a mobile telephone, or a memory card reader, among various other types of hosts.

Memory device 102 can be a DRAM memory device, an FeRAM memory device, among other types of memory devices. Memory device 102 includes a memory array 105 of memory cells, such as DRAM memory cells, ferroelectric memory cells, among other types of memory cells. For example, memory array 105 can include the memory arrays disclosed herein. Memory device 102 includes address circuitry 106 coupled to array 105 and configured to receive address signals (e.g., addresses) from host 103 for addressing locations in array 105.

Sense circuitry 107 can be used to read data from the array and couple output data to I/O circuitry 108. The I/O circuitry operates in a bi-directional manner to receive data from processor 103 and pass this data to array 105. In some examples, sense circuitry 107 can include the main sense amplifiers discussed herein. Memory device 102 includes control circuitry 109 to manage data storage and retrieval from the array in response to instructions generated by host 103. In some examples, control circuitry 109 can include a state machine and/or a sequencer.

Figure 2:
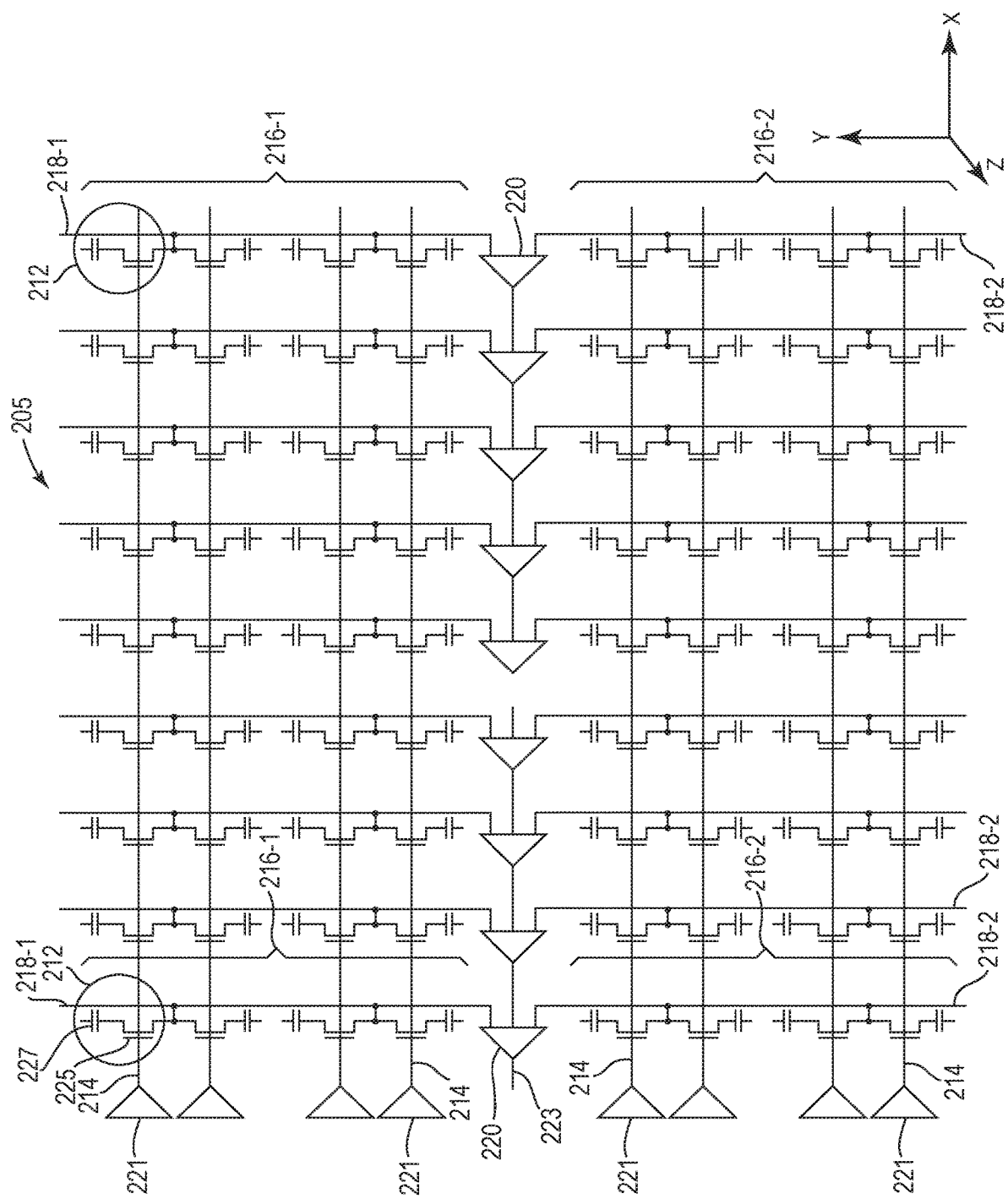
FIG. 2 is a schematic diagram of a memory array in accordance with a number of embodiments of the present disclosure.

FIG. 2 illustrates a schematic diagram of an example memory array 205, in accordance with a number of embodiments of the present disclosure. For example, memory array 205 can be a DRAM memory array, a FeRAM memory array, among other arrays. In some examples, memory array 205 can be at least a portion of memory array 105.

Memory array 205 can include memory cells 212 commonly coupled to access lines 214 that can extend in an x-direction in FIG. 2. Respective groups 216-1 of memory cells can be coupled to respective digit lines 218-1, and respective groups 216-2 of memory cells can be coupled to respective digit lines 218-2. Digit lines 218 can extend in the y-direction in FIG. 2. A respective local sense amplifier 220 can be coupled to respective digit lines 218-1 and 218-2. Each respective access line 214 can be coupled to a respective access line driver 221. In some examples, local sense amplifiers 220 can be commonly coupled to a bus 223. In some examples digit lines 218 can be referred to as local digit lines.

Each memory cell 212 can include an access device, such as an access transistor 225, and a capacitor 227. A capacitor 227 can be coupled to a respective digit line 218 through a respective access transistor 225 whose control gate can be coupled to a respective access line 214. For example, the respective access transistor 225 can selectively couple the capacitor 227 to the respective digit line 218 in response to the receiving an access signal from the respective access line 214. In some examples, a ferroelectric material can be between the plates of the capacitor.

The access transistors 225 can be planar transistors formed on pitch with the respective digit lines 218 and located below (i.e., under) the digit lines 218 (e.g., in the z direction as shown in FIG. 2). For example, access transistors 225 can be aligned with and be directly vertically below the respective digit lines 218. In some examples, a pair of digit lines 218-1 and 218-2 (e.g., complementary digit lines) commonly coupled to a respective sense amplifier 220 can be aligned with and selectively coupled to an additional (e.g., a hierarchical) digit line (not shown in FIG. 2), such as a digit line 350 in FIG. 3 or digit line 650 in FIG. 6. For example, the pair of digit lines 218-1 and 218-2 can be aligned with and be directly vertically below the additional access line. For example, each pair of digit lines 218-1 and 218-2 commonly coupled to a respective sense amplifier 220 can be on pitch with and coupled to respective access transistors 225 and on pitch with and selectively coupled to an additional access line.

Figure 3:
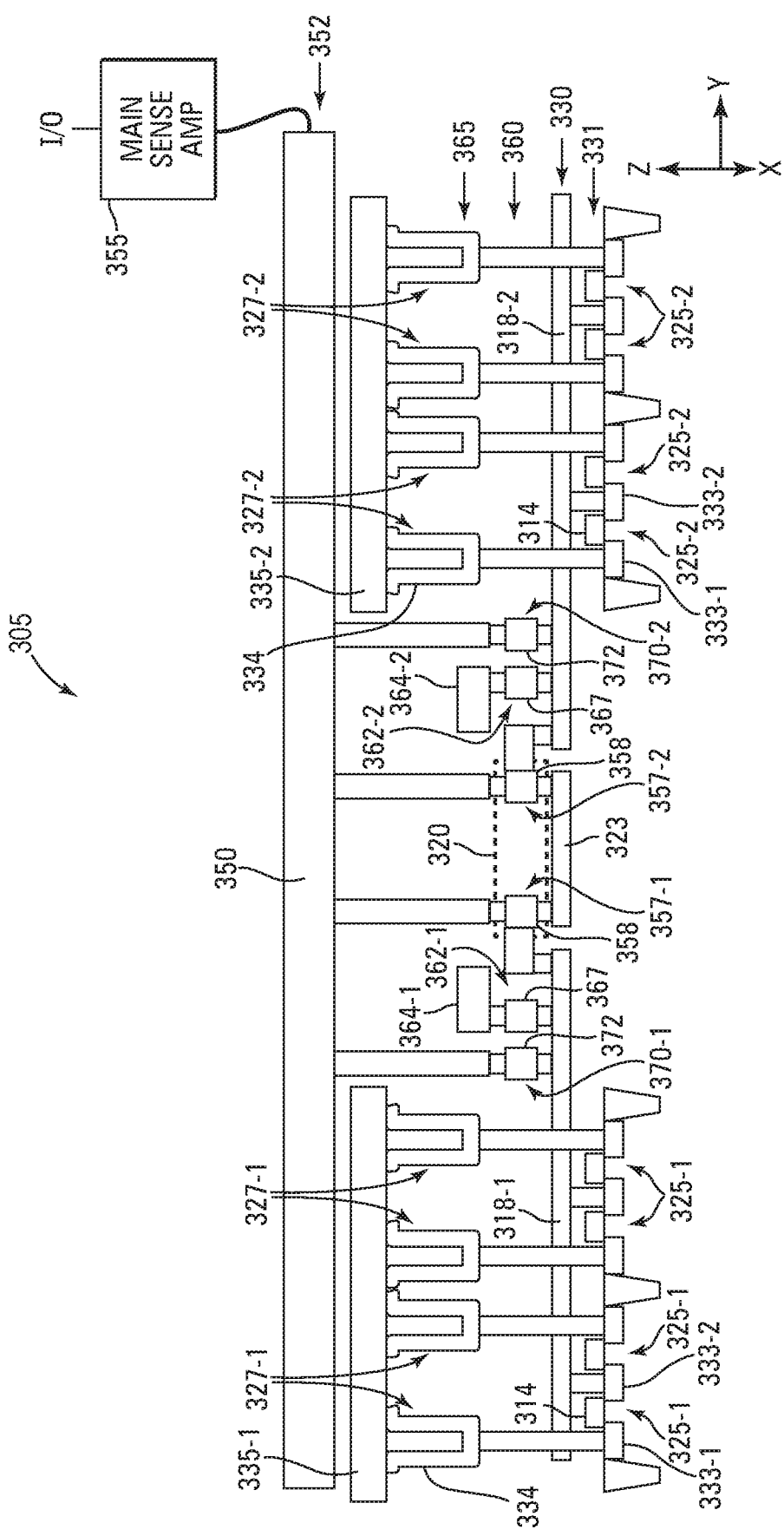
FIG. 3 is a cross-sectional view of a portion of a memory array in accordance with a number of embodiments of the present disclosure.

FIG. 3 is a cross-sectional view of a portion of a memory array, such as a memory array 305, in accordance with a number of embodiments of the present disclosure. For example, memory array 305 can be a portion of memory array 105 and/or memory array 205. In FIG. 3, the z-direction is perpendicular to the x- and y-directions and can be referred to as the vertical direction.

Digit lines 318-1 and 318-2 can be formed at a level (e.g., a vertical level) 330. Digit lines 318-1 and 318-2 can be selectively coupled to a digit line 350 formed at a level 352 that can be vertically above level 330 (e.g., in the z-direction). A local sense amplifier 320 that can correspond to a local sense amplifier 220 can be coupled to digit lines 318-1 and 318-2. Local sense amplifier 320 can be coupled between a digit line 350 and a bus 323 that can correspond to bus 223. For example, bus 323 can be formed at level 330 and can be between digit lines 318-1 and 318-2.

As used herein, the term "level" is used to refer to a generally planar region in a vertical direction (e.g., in the z-direction). Accordingly, elements formed at a particular level can refer to elements having at least a portion formed within a particular planar region in the vertical direction. Different levels can refer to planar regions that do not overlap (in the vertical direction). Accordingly, elements formed at different levels refer to elements that do not overlap in the vertical direction.

Digit line 350 can be coupled to a main sense amplifier 355. In some examples, local sense amplifier 320 can amplify signals, such as voltage and/or current signals, from digit line 318-1 or 318-2, corresponding to data values sensed from memory cells coupled to digit line 318-1 or 318-2 by local sense amplifier 320. Local sense amplifier 320 can then transmit the amplified signals to digit line 350 to be sensed by main sense amplifier 355 for output via I/O circuitry, such as I/O circuitry 108. In some examples, a reference signal (e.g., a reference voltage and/or current) can be supplied to sense amplifier 355 during sensing.

Sense amplifier 320 includes vertical TFTs 357-1 and 357-2 (e.g., that can be referred to as vertical sense amplifier TFTs) at a vertical level 360. Vertical TFTs 357-1 and 357-2 are coupled between bus 323 and digit line 350. Vertical TFTs 357-1 and 357-2 are configured to selectively couple bus 323 to digit line 350.

A vertical TFT 357 can include a control gate that can be a portion of a control line 358 at the level 360 between a source/drain coupled to bus 323 and source/drain coupled to digit line 350. The control gates of TFTs 357-1 and 357-2 can be respectively coupled to digit lines 318-1 and 318-2. Level 360 can be above level 330 and below level 352 so as to be between levels 330 and 352.

A vertical TFT can be defined as a TFT having respective source/drains at different levels and a control gate at a level between the respective levels of the respective source/drains and through which current passes in the z-direction between the respective source/drains when the TFT is activated. In some examples, a vertical TFT can be referred to as a switch, such as vertical TFT switch.

A vertical TFT 362-1 at level 360 can be coupled between a bus 364-1 and digit line 318-1, and a vertical TFT 362-2 at level 360 can be coupled between a bus 364-2 and digit line 318-2. For example, vertical TFT 362-1 can be configured to selectively couple bus 364-1 to digit line 318-1, and vertical TFT 362-2 can be configured to selectively couple bus 364-2 to digit line 318-2. Busses 364 can be at a level 365. Level 365 can be above level 360 and below level 352 so as to be between levels 352 and 360. Busses 364 can be referred to as a ground buses, in that busses 364 can be coupled to ground.

Vertical TFTs 362-1 and 362-2 can be referred to as vertical pre-charge TFTs, in that vertical TFTs 362-1 and 362-2 can respectively selectively couple digit lines 318-1 and 318-2 to busses 364-1 and 364-2 to pre-charge digit lines 318-1 and 318-2 (e.g., to ground). In some examples, there can be two or more vertical TFTs 362-1 electrically coupled in parallel between bus 364-1 and digit line 318-1, and two or more vertical TFTs 362-2 electrically coupled in parallel between bus 364-2 and digit line 318-2. A vertical TFT 362 can include a control gate that can be a portion of a control line 367 at the level 360 between a source/drain coupled to a bus 364 and a source/drain coupled to digit line 318. In some examples, TFTs 357 can have a lower threshold voltage than vertical TFTs 362.

A vertical TFT 370-1 at level 360 can be coupled between digit line 350 and digit line 318-1, and a vertical TFT 370-2 at level 360 can be coupled between digit line 350 and digit line 318-2. For example, vertical TFT 370-1 can be configured to selectively couple digit line 350 to digit line 318-1, and vertical TFT 370-2 can be configured to selectively couple digit line 350 to digit line 318-2. In some examples, there can be two or more vertical TFTs 370-1 electrically coupled in parallel between digit line 350 and digit line 318-1, and two or more vertical TFTs 370-2 electrically coupled in parallel between digit line 350 and digit line 318-2. A vertical TFT 370 can include a control gate that can be a portion of a control line 372 at the level 360 between a source/drain coupled to digit line 350 and a source/drain coupled to a digit line 318. In some examples, TFTs 357 can have a lower threshold voltage than vertical TFTs 370. Vertical TFTs 370 can be referred to as vertical multiplexing TFTs, for example.

The access transistors 325 (e.g., access transistors 325-1 and 325-2) can correspond to the access transistors 225 and can be at a level 331 that can be below level 330. In some examples, each access transistor 325 can include a control gate between source/drain regions 333-1 and 333-2. For example, the control gate can be a portion of an access line 314 that can correspond to an access line 214. The source/drain regions 333 can extend in the x-direction along the length of access lines 314. Note that control lines 358, 367, and 372 and buses 364 can also extend in the x-direction along the length of access lines 314. In some examples, an access transistor 325 can be referred to as planar transistor, in that source/drains 333-1 and 333-2 of the access transistor 325 can be in a common plane at a common level. The vertical TFTs disclosed herein can have relaxed leakage requirements compared to access transistors 325, for example.

Each respective source/drain region 333-1 can be coupled to a respective capacitor 327 that can correspond to a capacitor 227. Each of the capacitors 327-1 and 327-2 can include a capacitor plate 334 that can be shaped like a container. The capacitor plates 334 of capacitors 327-1 that can be selectively coupled to digit line 318-1 by access transistors 325-1 can be capacitively coupled to a common plate 335-1, and the capacitor plates 334 of capacitors 327-2 that can be selectively coupled to digit line 318-2 by access transistors 325-2 can be capacitively coupled to a common plate 335-2. Plates 335 can extend in the x-direction along the length of access lines 314. Different voltage potentials can be applied to plates 335 to store (e.g., program) different data values in capacitors 327.

Capacitors 327-1 coupled to respective access transistors 325-1 can be respective memory cells (e.g., that correspond to memory cells 212 in FIG. 2) of a group of memory cells (e.g., that correspond to a group 216-1 in FIG. 2) selectively coupled to digit line 318-1. Capacitors 327-2 coupled to respective access transistors 325-2 can be respective memory cells (e.g., that correspond to memory cells 212) of a group of memory cells (e.g., that correspond to a group 216-2 in FIG. 2) selectively coupled to digit line 318-2.

Figure 4A:
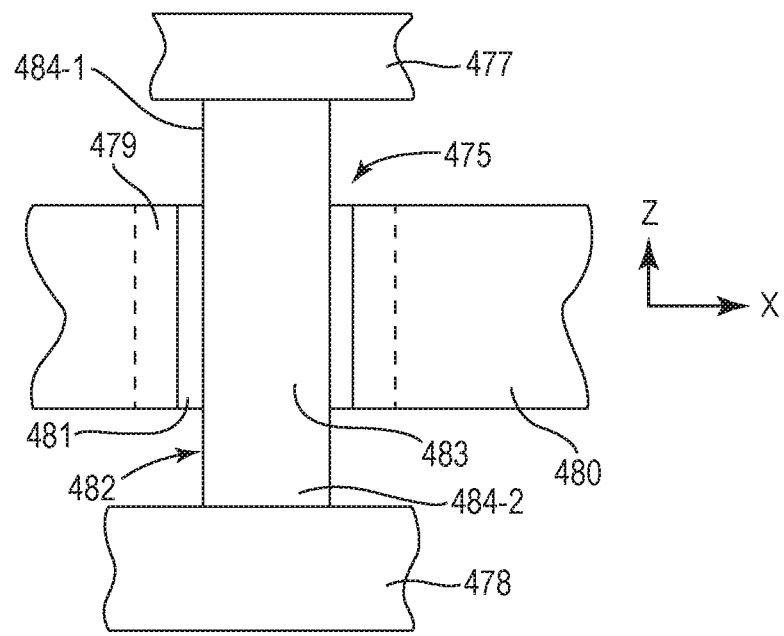
FIG. 4A is a cross-sectional view of a vertical thin film transistor in accordance with a number of embodiments of the present disclosure.
Figure 4B:
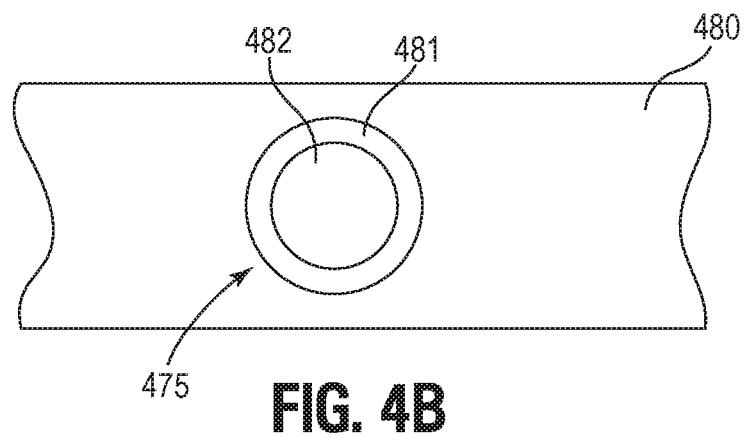
FIG. 4B is a top view of the vertical thin film transistor in FIG. 4A in accordance with a number of embodiments of the present disclosure.

FIG. 4A is a cross-sectional view of a vertical TFT in accordance with a number of embodiments of the present disclosure. FIG. 4B is a top view of the vertical TFT in FIG. 4A in accordance with a number of embodiments of the present disclosure. In FIG. 4A, a vertical TFT 475 is coupled between structures 477 and 478. For example, vertical TFT 475 can be configured to selectively electrically couple structure 477 to structure 478. Vertical TFT 475 can be any one of the vertical TFTs disclosed herein, such as TFTs 357, 362, or 370 in FIG. 3, and can be an n-channel or a p-channel vertical TFT. The structure 477 can be digit line 350 or a bus 364, and structure 478 can be a digit line 318 or bus 323.

TFT 475 can include a control gate 479 that can be a portion of a control line 480 that can be a control line 358, 367, or 372 in FIG. 3. Control gate 479 can wrap completely around a gate dielectric 481 that can wrap completely around a portion 483 of a vertical semiconductor structure 482 that can be polysilicon. A channel can form in portion 483 upon activation of TFT 475. Portion 483 can be between source/drains 484-1 and 484-2 of TFT 475 that are in semiconductor structure 482. For example, source/drain 484-1 can be coupled to structure 477 and source/drain 484-2 can be coupled to structure 478. For example, source/drains 484-1 and 484-2 can be at different vertical levels and current can flow vertically between source/drains 484-1 and 484-2.

Figure 5:
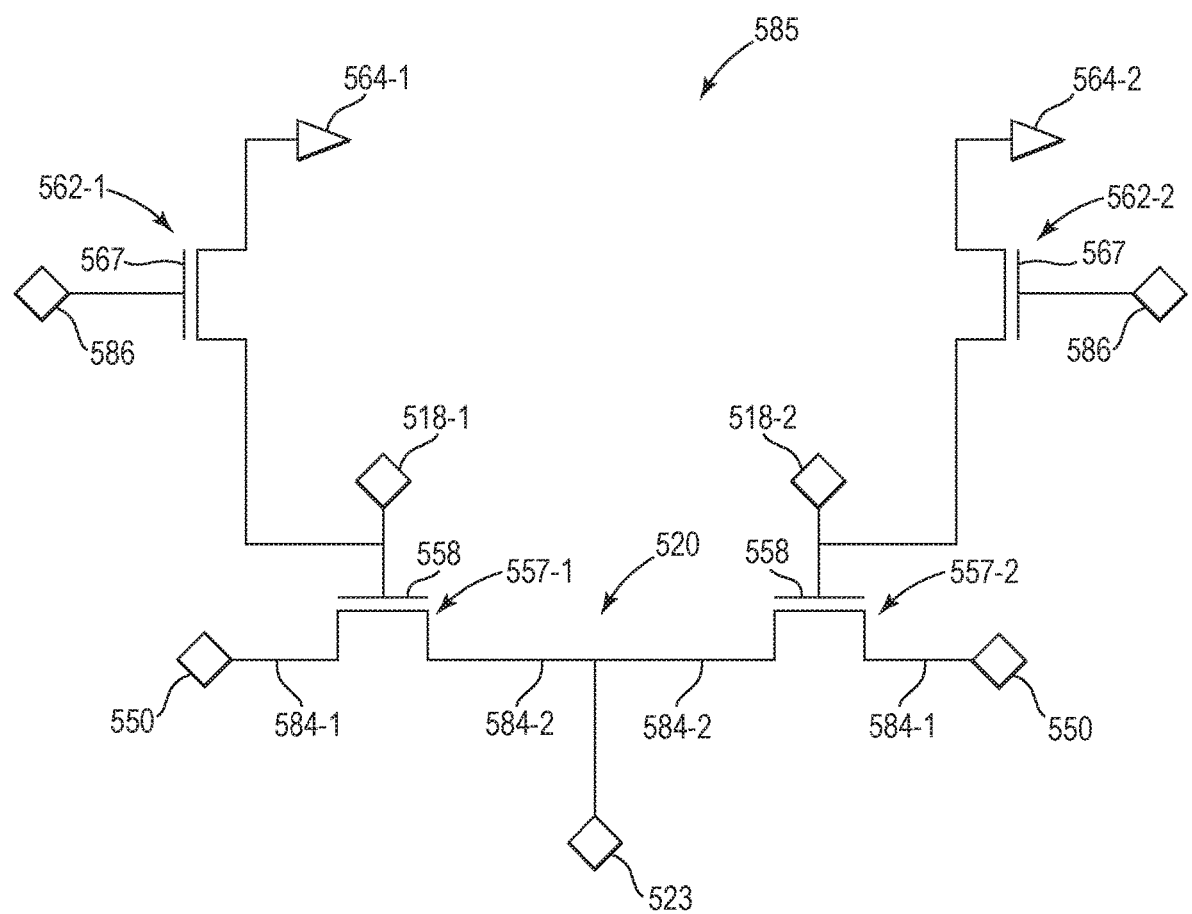
FIG. 5 is a schematic diagram of circuitry associated with a local sense amplifier in accordance with a number of embodiments of the present disclosure.

FIG. 5 is a schematic diagram of circuitry, such as circuitry 585, associated with a local sense amplifier, such as a local sense amplifier 520, in accordance with a number of embodiments of the present disclosure. For example, local sense amplifier 520 can be local sense amplifier 320.

Local sense amplifier 520 can include vertical TFTs 557-1 and 557-2 respectively corresponding to vertical TFTs 357-1 and 357-2 in FIG. 3. Source/drains 584-2 of TFTs 557-1 and 557-2 can be coupled to a node 523 that can correspond to bus 323 in FIG. 3. Source/drains 584-1 of TFTs 557-1 and 557-2 can be coupled to a node 550 that can correspond to digit line 350 in FIG. 3. Control gates of 558 TFTs 557-1 and 557-2 (e.g., that can correspond to control lines 358 in FIG. 3) can be respectively coupled to nodes 518-1 and 518-2 that can respectively correspond to digit lines 318-1 and 318-2 in FIG. 3.

Circuitry 585 can include vertical TFTs 562-1 and 562-2 respectively corresponding to vertical TFTs 362-1 and 362-2 in FIG. 3. A source/drain of TFT 562-1 can be coupled to node 518-1 and the control gate 558 of TFT 557-1. A source/drain of TFT 562-2 can be coupled to node 518-2 and the control gate 558 of TFT 557-2. The other source/drain of TFT 562-1 can be coupled to a node 564-1 that can correspond to bus 364-1 in FIG. 3. The other source/drain of TFT 562-2 can be coupled to a node 564-2 that can correspond to bus 364-2 in FIG. 3. The control gates 567 of TFTs 562-1 and 562-2 (e.g., that can correspond to control lines 367 in FIG. 3) can be coupled to an activation node 586. In some examples, nodes 564 can be grounded.

In some examples, TFTs 557-1 and 557-2 can be n-channel TFTs and TFTs 562-1 and 562-2 can be n-channel TFTs. For example, sense amplifier 520 can be an n-type sense amplifier. For example, during operation, node 518-1, and thus the control gate 558 of TFT 557-1, can be pre-charged to ground in response to activating TFT 562-1, or node 518-2, and thus the control gate 558 of TFT 557-2, can be pre-charged to ground in response to activating TFT 562-2. While a control gate 558 is grounded, a negative voltage potential can be applied to node 523, and thus a source/drain 584-2, and a positive voltage potential, such as a power supply voltage (e.g., VCC), can be applied to node 550. For example, the negative voltage potential applied to node 523 can activate (e.g., turn on) sense amplifier 520. For example, node 523 can supply power to sense amplifier 520. In the case where TFTs 557-1 and 557-2 can be p-channel TFTs (e.g., sense amplifier 520 can be a p-type sense amplifier) and TFTs 562-1 and 562-2 can be p-channel TFTs, while a control gate 558 is grounded, a positive voltage potential can be applied to node 523, and thus a source/drain 584-2, and a negative voltage potential, such as negative VCC, can be applied to node 550.

Figure 6:
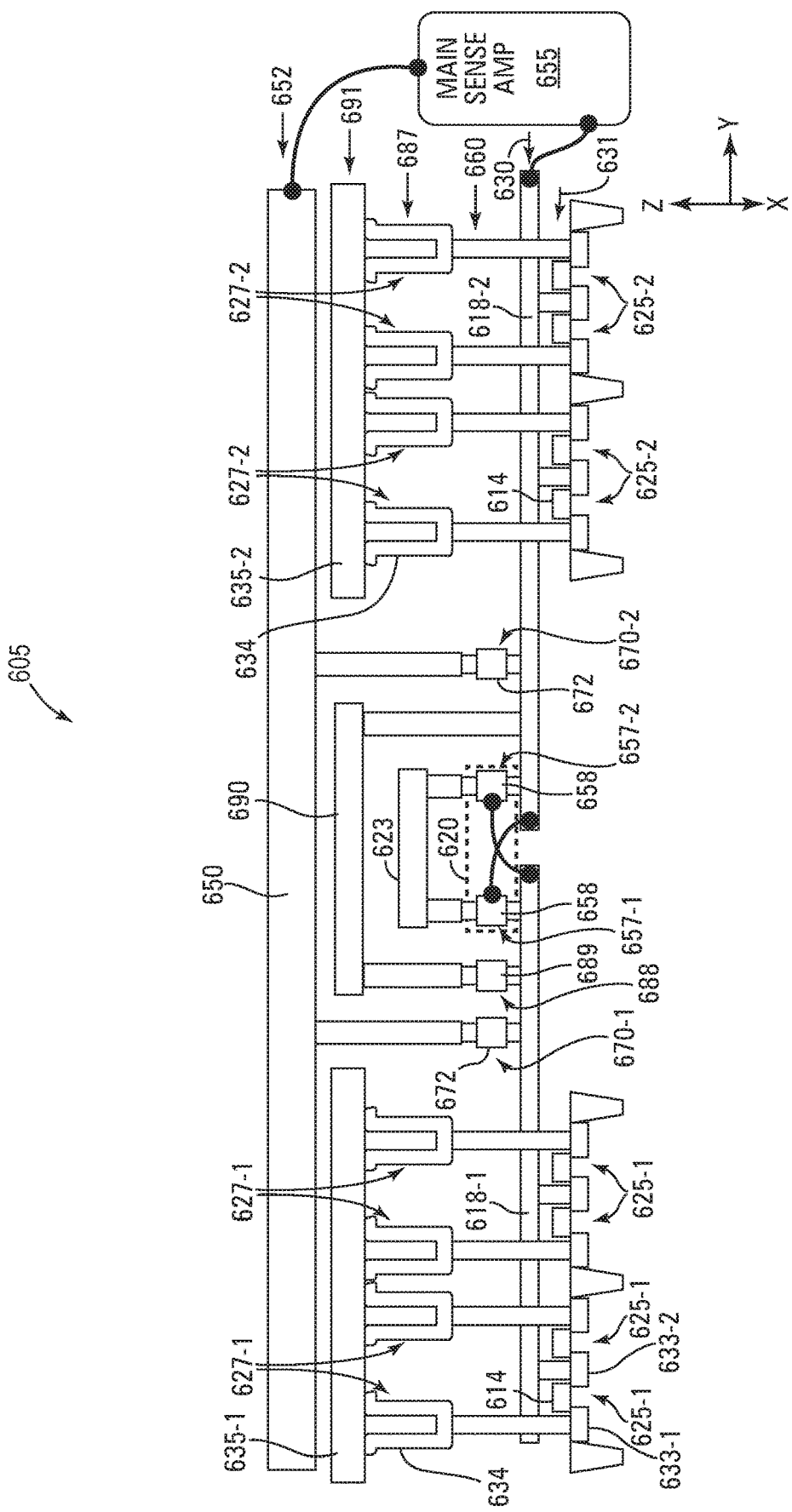
FIG. 6 is a cross-sectional view of a portion of a memory array in accordance with a number of embodiments of the present disclosure.

FIG. 6 is a cross-sectional view of a portion of a memory array, such as a memory array 605, in accordance with a number of embodiments of the present disclosure. For example, memory array 605 can be a portion of memory array 105 and/or memory array 205.

Digit lines (e.g., local digit lines) 618-1 and 618-2 can be at a level 630. Digit lines 618-1 and 618-2 can be selectively coupled to a digit line 650 that is at a level 652 that can be vertically above level 630. A local sense amplifier 620 that can correspond to a local sense amplifier 220 can be coupled to digit lines 618-1 and 618-2. Local sense amplifier 620 can be coupled to a bus 623 that can correspond to bus 223. For example, bus 623 can be at a level 687 that is above level 660 and below level 652 so as to be between level 660 and level 652.

Sense amplifier 620 includes vertical TFTs 657-1 and 657-2 (e.g., that can be referred to as vertical sense amplifier TFTs) at a vertical level 660. Vertical TFT 657-1 is coupled between digit line 618-1 and bus 623, and vertical TFT 657-2 is coupled between digit line 618-2 and bus 623. Vertical TFT 657-1 is configured to selectively couple digit line 618-1 to bus 623, and vertical TFT 657-2 is configured to selectively couple digit line 618-2 to bus 623.

A vertical TFT 657 can include a control gate that can be a portion of a control line 658 at the level 660 between a source/drain coupled to bus 623 and source/drain coupled to a digit line 618. The control gate of TFT 657-1 can be coupled to digit line 618-2, and the control gate of TFT 657-2 can be coupled to digit line 618-1. Level 660 can be above level 630 and below level 652 so as to be between levels 630 and 652.

A vertical TFT 670-1 at level 660 can be coupled between digit line 650 and digit line 618-1, and a vertical TFT 670-2 at level 660 can be coupled between digit line 650 and digit line 618-2. For example, vertical TFT 670-1 can be configured to selectively couple digit line 650 to digit line 618-1, and vertical TFT 670-2 can be configured to selectively couple digit line 650 to digit line 618-2. In some examples, there can be two or more vertical TFTs 670-1 electrically coupled in parallel between digit line 650 and digit line 618-1, and two or more vertical TFTs 670-2 electrically coupled in parallel between digit line 650 and digit line 618-2. A vertical TFT 670 can include a control gate that can be a portion of a control line 672 at the level 660 between a source/drain coupled to a digit line 650 and a source/drain coupled to digit line 618. Vertical TFTs 670 can be referred to as vertical multiplexing TFTs in some examples.

Digit line 650 can be coupled to a main sense amplifier 655. In some examples, local sense amplifier 620 can amplify signals, such as voltage and/or current signals, from digit line 618-1 or digit line 618-2, corresponding to data values sensed from memory cells coupled to digit line 618-1 or digit line 618-2 by local sense amplifier 620. The amplified signals from digit line 618-1 can be transmitted to digit line 650 through activated TFT 670-1, and amplified signals from digit line 618-2 can be transmitted to digit line 650 through activated TFT 670-2. The amplified signals can be sensed by main sense amplifier 655 for output via I/O circuitry, such as I/O circuitry 108. In some examples, a reference signal (e.g., a reference voltage and/or current) can be supplied to sense amplifier 655 during sensing. In some examples, digit lines 618-1 and 618-2 and digit line 650 can be pre-charged to a voltage potential, such as VCC.

In some examples, digit lines 618-1 and 618-2 and digit line 650 can be pre-charged to the voltage VCC/2. In such examples, a vertical TFT 688 that can be referred to as a vertical jumper TFT can be coupled between digit lines 618-1 and 618-2. For example, vertical TFT 688 can be configured to selectively couple digit line 618-1 to digit line 618-2. Moreover, digit line 618-2 can be coupled to main sense amplifier 655 in addition to digit line 655 to provide the voltage VCC/2 as a reference voltage to main sense amplifier 655.

In some examples, vertical TFT 688 can be activated to selectively electrically couple digit line 618-1 to main sense amplifier 655 through digit line 618-2 while a memory cell coupled to digit line 618-1 is being sensed or can remain deactivated so digit line 618-1 is not electrically coupled to digit line 618-2, and thus main sense amplifier 655, while a memory cell coupled to digit line 618-2 is being sensed. Vertical TFT 688 can include a control gate that can be a portion of a control line 689 at the level 660 between a source/drain coupled to digit line 618-1 and a source/drain coupled to digit line 618-2 through a line 690 at a level 691. For example, level 691 can be below level 652 and above level 687 so as to be between levels 652 and 687.

In some examples, digit lines 618-1 and 618-2 can be in-line with each other. For example, a single straight line extending in the y-direction at a single location in the x-direction can be co-linear with central axes of digit lines 618-1 and 618-2. Alternatively, digit lines 618-1 and 618-2 can be staggered, so that central axes of digit lines 618-1 and 618-2 are at different locations in the x-direction and so that portions of digit lines 618-1 and 618-2 overlap for a range of locations in the y-direction.

The access transistors 625 (e.g., access transistors 625-1 and 625-2) can correspond to the access transistors 225 and can be at a level 631 that can be below level 630. In some examples, each access transistor 625 can include a control gate between source/drain regions 633-1 and 633-2. For example, the control gate can be a portion of an access line 614 that can correspond to an access line 214. The source/drain regions 633 can extend in the x-direction along the length of access lines 614. Note that control lines 658, 672, and 689 and bus 623 can also extend in the x-direction along the length of access lines 614.

Each respective source/drain region 633-1 can be coupled to a respective capacitor 627 that can correspond to a capacitor 227. Each of the capacitors 627-1 and 627-2 can include a capacitor plate 634 that can be shaped like a container. The capacitor plates 634 of capacitors 627-1 that can be selectively coupled to digit line 618-1 by access transistors 625-1 can be capacitively coupled to a common plate 635-1, and the capacitor plates 634 of capacitors 627-2 that can be selectively coupled to digit line 618-2 by access transistors 625-2 can be capacitively coupled to a common plate 635-2. Plates 635 can extend in the x-direction along the length of access lines 614.

Capacitors 627-1 coupled to respective access transistors 625-1 can be respective memory cells (e.g., that correspond to memory cells 212 in FIG. 2) of a group of memory cells (e.g., that correspond to a group 216-1 in FIG. 2) selectively coupled to digit line 618-1. Capacitors 627-2 coupled to respective access transistors 625-2 can be respective memory cells (e.g., that correspond to memory cells 212) of a group of memory cells (e.g., that correspond to a group 216-2 in FIG. 2) selectively coupled to digit line 618-2.

As used herein, "a" or "an" can refer to one or more of something, and "a number of" something can refer to one or more of such things. For example, a number of memory cells can refer to one or more memory cells. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship). It should be recognized the term vertical accounts for variations from "exactly" vertical due to routine manufacturing, measuring, and/or assembly variations. It should be recognized the term perpendicular accounts for variations from "exactly" perpendicular due to routine manufacturing, measuring, and/or assembly variations.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. An apparatus, comprising:
a memory array comprising a first group of memory cells coupled to a first digit line at a first level and a second group of memory cells coupled to a second digit line at the first level;
a third digit line at a second level;
a local sense amplifier coupled to the first and second digit lines;
a first vertical thin film transistor at a third level between the first and second levels and coupled between the first digit line and the third digit line;
a second vertical thin film transistor at the third level and coupled between the second digit line and the third digit line;
a main sense amplifier coupled to the third digit line; and
a bus at the first level, wherein the local sense amplifier comprises:
a third vertical thin film transistor at the third level and coupled between the bus and the third digit line, a control gate of the third vertical thin film transistor coupled to the first digit line; and
a fourth vertical thin film transistor at the third level and coupled between the bus and the third digit line, a control gate of the fourth vertical thin film transistor coupled to the second digit line.

2. The apparatus of claim 1, wherein the bus is a first bus, the apparatus further comprising:
second and third buses at a level between the second and third levels;
a fifth vertical thin film transistor at the third level and coupled between the first digit line and the second bus; and
a sixth vertical thin film transistor at the third level and coupled between the second digit line and the third bus.

3. The apparatus of claim 1, further comprising the third vertical thin film transistor at the third level coupled between the first and second digit lines.

4. The apparatus of claim 3, wherein the first digit line is coupled to the main sense amplifier.

5. The apparatus of claim 1, wherein the first and second vertical thin film transistors are n-channel transistors.

6. The apparatus of claim 1, wherein the first and second vertical thin film transistors are p-channel transistors.

7. The apparatus of claim 1, wherein the first and second groups of memory cells each comprise dynamic random access memory cells.

8. An apparatus, comprising:
a memory array comprising a first group of memory cells coupled to a first digit line at a first level and a second group of memory cells coupled to a second digit line at the first level, wherein:
each of the memory cells of the first group comprises a capacitor selectively coupled to the first digit line by a respective first access device at a fourth level;
each of the memory cells of the second group comprises a capacitor selectively coupled to the second digit line by a respective second access device at the fourth level;
the first level is above the fourth level and between the third and fourth levels; and
the second level is above the third level and the third level is above the first level
a third digit line at a second level;
a local sense amplifier coupled to the first and second digit lines;
a first vertical thin film transistor at a third level between the first and second levels and coupled between the first digit line and the third digit line;
a second vertical thin film transistor at the third level and coupled between the second digit line and the third digit line; and
a main sense amplifier coupled to the third digit line.

9. An apparatus, comprising:
a memory array comprising a first group of memory cells coupled to a first digit line at a first level and a second group of memory cells coupled to a second digit line at the first level;
a bus at the first level between the first and second digit lines;
a third digit line at a second level;
a local sense amplifier comprising:
a first vertical thin film transistor at a third level between the first and second levels, the first vertical thin film transistor configured to selectively couple the bus to the third digit line, and
a second vertical thin film transistor at the third level, the second vertical thin film transistor configured to selectively couple the bus to the third digit line.

10. The apparatus of claim 9, wherein:
the first digit line is coupled to a control gate of the first vertical thin film transistor; and
the second digit line is coupled to a control gate of the second vertical thin film transistor.

11. The apparatus of claim 9, wherein the third digit line is coupled to a main sense amplifier.

12. The apparatus of claim 9, further comprising:
a third vertical thin film transistor at the third level and coupled between the first digit line and the third digit line, the third vertical thin film transistor configured to selectively couple the first digit line to the third digit line; and
a fourth vertical thin film transistor at the third level and coupled between the second digit line and the third digit line, the fourth vertical thin film transistor configured to selectively couple the second digit line to the third digit line.

13. The apparatus of claim 12, wherein the first and second vertical thin film transistors have lower threshold voltages than the third and fourth vertical thin film transistors.

14. The apparatus of claim 9, wherein the bus is a first bus, the apparatus further comprising:
- a third vertical thin film transistor at the third level and coupled between a second bus and the first digit line, the third vertical thin film transistor configured to selectively couple the second bus to the first digit line; and
- a fourth vertical thin film transistor at the third level and coupled between the third bus and the second digit line, the fourth vertical thin film transistor configured to selectively couple the third bus to the second digit line.

15. The apparatus of claim 14, wherein the second and third buses are configured to be coupled to ground.

16. The apparatus of claim 15, wherein the first bus is configured to be coupled to a negative voltage potential and the third digit line is configured to be coupled to a positive voltage potential.

17. The apparatus of claim 15, wherein the first bus is configured to be coupled to a positive voltage potential and the third digit line is configured to be coupled to a negative voltage potential.

18. The apparatus of claim 14, wherein the second and third buses are each at a level the between the second and third levels.

19. An apparatus, comprising:
- a memory array comprising a first group of memory cells coupled to a first digit line at a first level and a second group of memory cells coupled to a second digit line at the first level;
- a bus at the first level between the first and second digit lines;
- a third digit line at a second level;
- a first vertical thin film sense amplifier transistor at a third level between the first and second levels and coupled between the bus and the third digit line, the first vertical thin film sense amplifier transistor comprising a first control gate coupled to the first digit line;
- a first vertical thin film transistor switch at the third level and coupled to the first control gate through the first digit line, the first vertical thin film transistor switch configured to selectively couple the first control gate to ground;
- a second vertical thin film sense amplifier transistor at the third level and coupled between the bus and the third digit line, the second vertical thin film sense amplifier transistor comprising a second control gate coupled to the second digit line; and
- a second vertical thin film transistor switch at the third level and coupled to the second control gate through the second digit line, the second vertical thin film transistor switch configured to selectively couple the second control gate to ground.

20. The apparatus of claim 19, further comprising:
- a third vertical thin film transistor switch at the third level and coupled between the first and third digit lines; and
- a fourth vertical thin film transistor switch at the third level and coupled between the second and third digit lines.

21. The apparatus of claim 19, wherein:
the first, second, and third levels are vertical levels; and
the second level is above third level and the third level is above the first level.

22. An apparatus, comprising:
- a memory array comprising a first group of memory cells coupled to a first digit line at a first level and a second group of memory cells coupled to a second digit line at the first level,
- a third digit line at a second level;
- a local sense amplifier coupled to the first and second digit lines;
- a first vertical thin film transistor at a third level between the first and second levels and coupled between the first digit line and the third digit line;
- a second vertical thin film transistor at the third level and coupled between the second digit line and the third digit line;
- a main sense amplifier coupled to the third digit line; and
- a bus at a fourth level between the second and third levels, wherein the local sense amplifier comprises:
  - a fourth vertical thin film sense transistor at the third level and coupled between the first digit line and the bus, a control gate of the third vertical thin film transistor coupled to the second digit line; and
  - a fifth vertical thin film transistor at the third level and coupled between the second digit line and the bus, a control gate of the fourth vertical thin film transistor coupled to the first digit line.

23. The apparatus of claim 8, wherein the first and second access devices are first and second planar access devices.

* * * * *